United States Patent
Shui

(10) Patent No.: US 7,098,730 B1
(45) Date of Patent: Aug. 29, 2006

(54) PROCESS VARIATION TRIM/TUNING FOR CONTINUOUS TIME FILTERS AND Δ-Σ ANALOG TO DIGITAL CONVERTERS

(75) Inventor: Tao Shui, San Jose, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 10/873,938

(22) Filed: Jun. 22, 2004

(51) Int. Cl.
*H04B 1/10* (2006.01)
(52) U.S. Cl. .................................. 327/553; 327/552
(58) Field of Classification Search ......... 327/552–559
See application file for complete search history.

(56) References Cited

U.S. PATENT DOCUMENTS

| | | | | |
|---|---|---|---|---|
| 5,243,345 A | * | 9/1993 | Naus et al. ................. | 341/143 |
| 5,392,042 A | * | 2/1995 | Pellon ........................ | 341/143 |
| 6,060,935 A | * | 5/2000 | Shulman ..................... | 327/345 |
| 6,304,134 B1 | * | 10/2001 | Pavan ........................ | 327/552 |
| 6,362,763 B1 | * | 3/2002 | Wang .......................... | 341/143 |
| 6,765,520 B1 | * | 7/2004 | Chuang et al. ............. | 341/143 |
| 2005/0052226 A1 | * | 3/2005 | Doerrer ...................... | 327/552 |

* cited by examiner

*Primary Examiner*—Terry D. Cunningham
*Assistant Examiner*—Thomas J. Hiltunen
(74) *Attorney, Agent, or Firm*—Blakely Sokoloff Taylor & Zafman LLP

(57) ABSTRACT

Continuous time filters and Δ-Σ analog to digital converters and methods for process variation trim/tuning. In feed forward filters, the resistance of feed forward transconductance elements are adjusted to compensate for process variation in the $G_M/SC$ values in the filters. Since all. $G_M/SC$ values are subject to the same RC process variation, and the resistance in all feed forward transconductance elements is also subject to the same R process variation, the resistance in the feed forward transconductance elements may be adjusted in accordance with analytically predetermined factors based on a single measurement of the RC process variation for each filter to compensate for the overall RC process variation. Various embodiments are disclosed, both as feed forward filters and as Δ-Σ analog to digital converter systems using such filters.

31 Claims, 4 Drawing Sheets

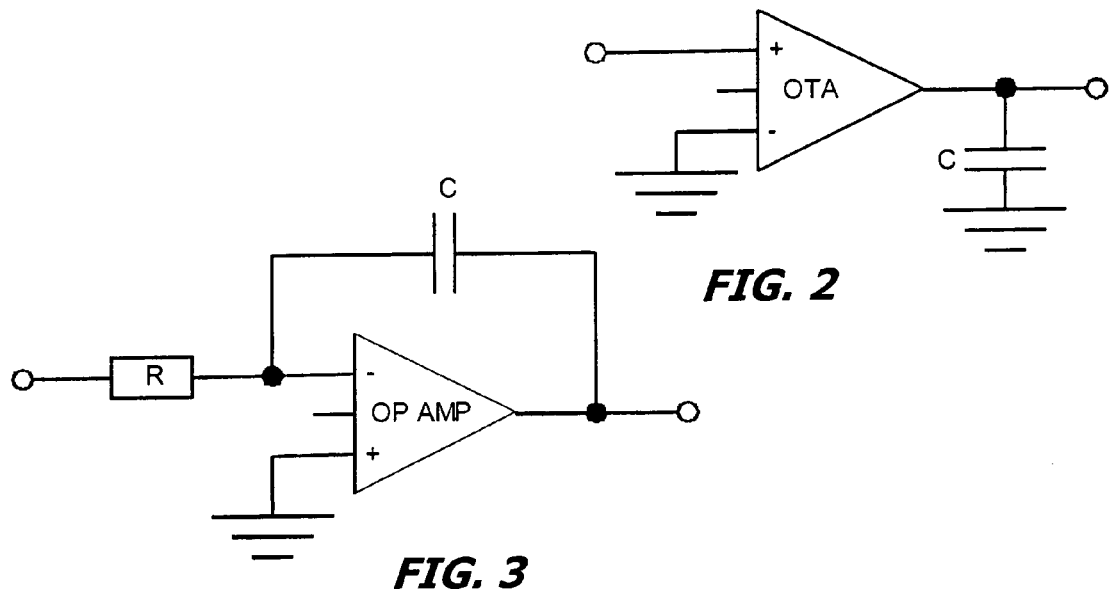
FIG. 2
FIG. 3
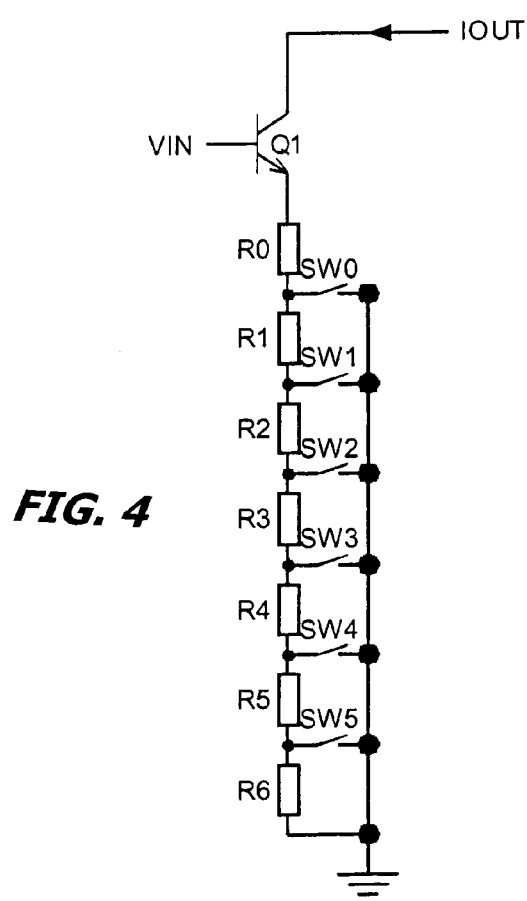
FIG. 4

PROCESS VARIATION TRIM/TUNING FOR CONTINUOUS TIME FILTERS AND Δ-Σ ANALOG TO DIGITAL CONVERTERS

BACKGROUND OF THE INVENTION

1. Field of the Invention

The present invention relates to the field of continuous-time filtering and Δ-Σ analog to digital converters.

2. Prior Art

Continuous-time filters which utilize feed-forward topologies, feedback topologies or both are used for various purposes. One such use is in receivers in wireless networks. Such filters generally use multi-stages of transconductance amplifiers and integration capacitors. Because of process variations, the poles of the loop filter will change accordingly, leading to degraded performance or even resulting in instability.

The conventional wisdom is to tune or trim the integration capacitors (C) and/or transconductors of each stage ($G_{Mi}$, i=1, 2, 3, 4). There are several drawbacks with these previous methods:

1) Tune/trim of the transconductance ($G_M$) of each stage will affect the noise performance of the overall filter/modulator, especially for $G_{m1}$ (the first stage);

2) For multi-band/multi-corner (multi-standard) frequency applications such as wireless cellular, the $G_M$'S and C's have to be adjusted for each standard, which results in inefficient implementations, extra complexity and degraded performance.

BRIEF DESCRIPTION OF THE DRAWINGS

FIG. 2 is a diagram of an exemplary transconductance element using an operational transconductance amplifier.

FIG. 3 is a diagram of an exemplary transconductance element using an ordinary operational amplifier.

FIG. 4 is a diagram illustrating a variable resistance network that may be used with a controllable transconductance element.

DETAILED DESCRIPTION OF THE PREFERRED EMBODIMENTS

The present invention can trim/tune the corner frequency of continuous-time filters and Δ-Σ ADCs with respect to process variations causing resistance and capacitance variations. It can ensure the desired frequency response of a continuous-time filter and/or make a continuous-time Δ-Σ ADC coupled to the filter stable and achieve optimum dynamic range. The present invention also allows changing the corner frequencies of the filters in accordance with different standards in a multi-band/multi-corner (multi-standard) frequency application such as wireless cellular. The principle of the present invention can also be applied to any continuous-time filters which utilize a feed forward, feed-back or both topologies.

Figure 1:
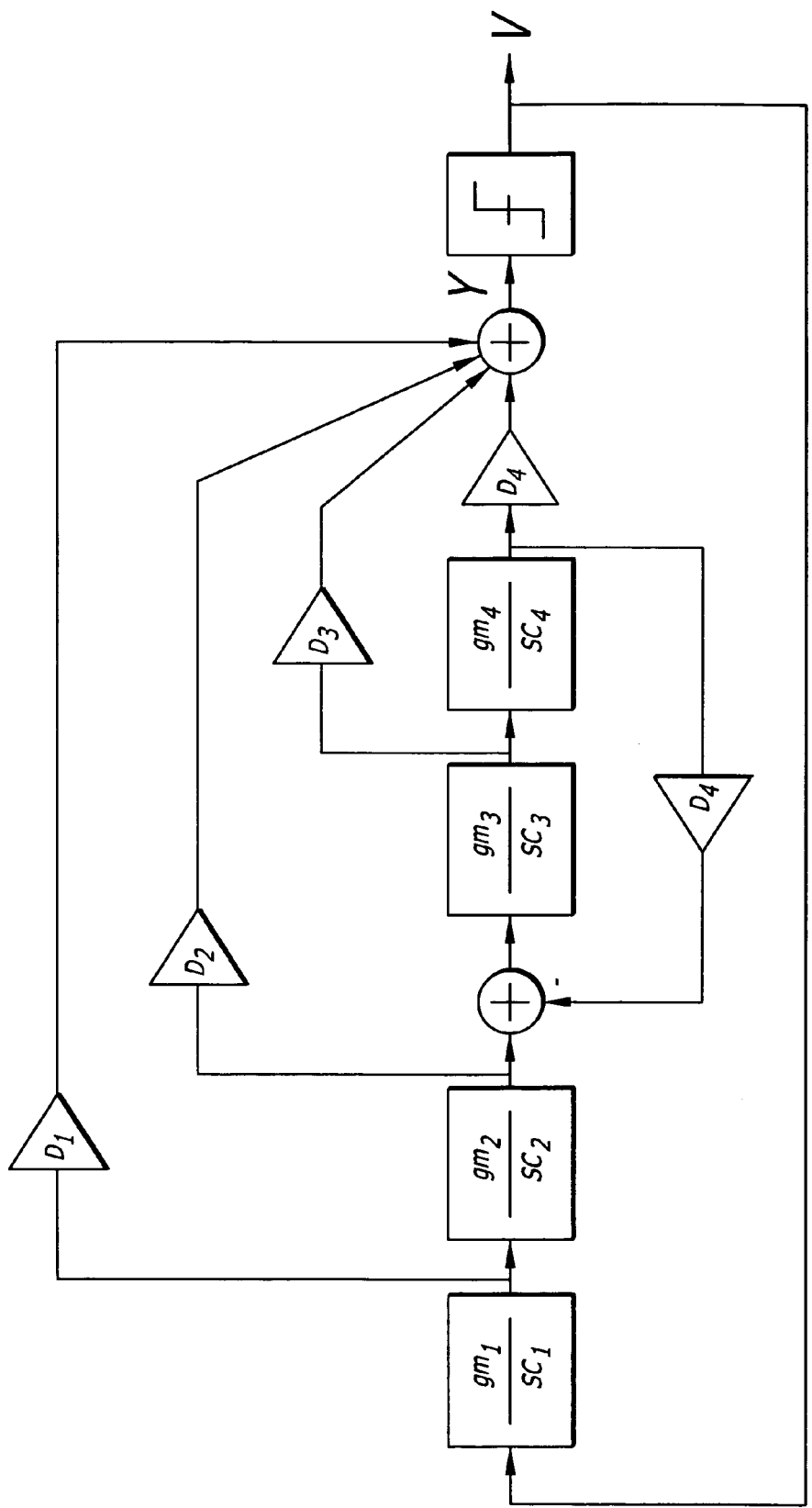
FIG. 1 is a diagram for an exemplary 4th order feed-forward filter in which the present invention is incorporated.

An exemplary feed-forward filter, specifically a 4th order filter, may be seen in FIG. 1. Also shown in this Figure is a Δ-Σ ADC coupled to the output Y of the filter. The $G_M$/SC elements of the filter may be realized in various ways, such as, by way of example, by an operational transconductance amplifier with a capacitive load as in FIG. 2, or by an operational amplifier with resistive input and capacitive feedback as in FIG. 3. A simplified transconductance element may be seen in FIG. 4. In any case, a $G_M$/SC element will have a transfer function that will vary with process due to variations in resistance values and capacitance values. However process variations will have minimal effect on resistance ratios and capacitance ratios.

The loop filter transfer function of the 4th order feed-forward structure of FIG. 1 is:

$$Y = V \frac{D_1}{S \frac{C_1}{G_{M1}}} + V \frac{D_2}{S^2 \frac{C_1}{G_{M1}} \frac{C_2}{G_{M2}}} + V \frac{1}{S^2 \frac{C_1}{G_{M1}} \frac{C_2}{G_{M2}}} \frac{G_{M3} S C_4}{S^2 C_3 C_4 + G_{M4} G_2} D_3 +$$

$$\frac{G_{M4}}{SC_4} \frac{V_{D4}}{S^2 \frac{C_1}{G_{M1}} \frac{C_2}{G_{M2}}} \frac{G_{M3} S C_4}{S^2 C_3 C_4 + G_{M4} G_2}$$

$$\therefore \frac{Y}{V} = \frac{G_{M1}}{SC_1} D_1 + \frac{G_{M1} G_{M2}}{S^2 C_1 C_2} D_2 + \frac{G_{M1} G_{M2} G_{M3}}{SC_1 C_2 C_3 \left( S^2 + \frac{G_{M4} G_2}{C_3 C_4} \right)} D_3 +$$

$$\frac{G_{M1} G_{M2} G_{M3} G_{M4}}{S^2 C_1 C_2 C_3 C_4 \left( S^2 + \frac{G_{M4} G_2}{C_3 C_4} \right)} D_4$$

Process variations may typically change the R and C values with regard to their nominal values by as much as ±20% and ±10%, respectively. Thus, the poles of the loop filter will change accordingly, leading to degraded performance or even resulting in instability.

The present invention is based on the observation that changing the coefficients $D_1$, $D_2$, $D_3$ and $D_4$ has the same effect on the loop filter's pole location as would be the case of changing the $G_M$'S and/or C's. In other words, if a $G_M$/C value needs to be scaled by K, the same effect can be achieved by scaling the respective value of D.

In actual implementation, the process data can be obtained before tuning/trimming of the $D_i$ values. Assume the actual measured $G_M$/C ratio is K times its nominal value, where $D_0$, $G_{M0}$ and $C_0$ are the nominal values of D, $G_M$ and C, respectively:

$$\frac{G_M}{C} = K \frac{G_{M0}}{C_0}, \text{ or } \frac{1}{RC} = K \frac{1}{R_0 C_0}$$

Because the ratios of resistances and the ratios of capacitances are substantially unaffected by process variations, the process variation will be the same for each $G_M$/SC element, though not with the same effect. The coefficients $D_1$ through $D_4$ for the exemplary filter of FIG. 1 may be trimmed using the following table, given the process variation for RC:

TABLE 1

Trim Table of $D_i$ vs Process Corner

| Process Corner | $\frac{RC}{R_0 C_0}$ | $\frac{D_1}{D_{10}}$ | $\frac{D_2}{D_{20}}$ | $\frac{D_3}{D_{30}}$ | $\frac{D_4}{D_{40}}$ | $\frac{G_2}{G_{20}}$ |
|---|---|---|---|---|---|---|
| Nominal | 1 | 1 | 1 | 1 | 1 | 1 |

TABLE 1-continued

Trim Table of $D_i$ vs Process Corner

| Deviated Corner | $\frac{1}{K}$ | $\frac{1}{K^{1.5}}$ | $\frac{1}{K^{2.5}}$ | $\frac{1}{K^{3.5}}$ | $\frac{1}{K^{4.5}}$ | $\frac{1}{K^2}$ |
|---|---|---|---|---|---|---|

The foregoing table is based on ordinary circuit analysis, and of course will vary with the actual circuit design. In an actual implementation, $D_i$ (i=1, 2, 3, 4) are realized as transconductors (see FIG. 4 for an example) with their $G_{Mi}=D_i$. Since $G_{Mi}=1/R_i$, $R_i$ itself also depends on the process variation. As the ratio of $R_i/R_{i0}$ is unknown, its contribution can be simplified as $\sqrt{RC}$. This is why there are fractional power series in Table 1. It of course assumes that the resistive element in each of the elements $D_i$ has the same percentage process variation as the resistive element in the $G_M/C$ elements, as will be the case when realized as an integrated circuit.

The resistances for each $D_i$ may be configured in various ways. By way of example, a ladder configuration of resistors R0 through R6 (see FIG. 4) may be used, with MOS devices SW0 through SW5 switching appropriate resistors into the circuit to control the overall resistance of the network. The code preferably used is a thermometer code, though networks with a binary progression of resistance values could be used if desired. The switch settings may be stored in memory in the receiver, or non-volatile, electrically alterable devices may be used. As another example, laser trimming may be used rather than switches, though this is not preferred because of the permanence of the trimming.

Figure 5:
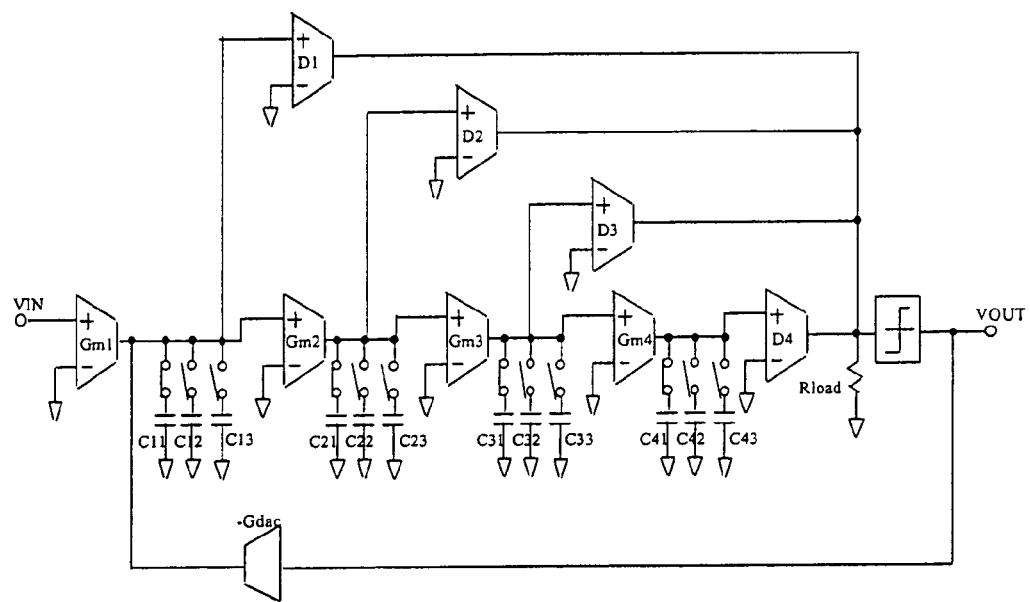
FIG. 5 is a diagram for another exemplary 4th order feed-forward filter in which the present invention is incorporated.

Now referring to FIG. 5, another exemplary 4th order feed-forward filter may be seen. In this filter, the output of the Δ-Σ analog to digital converter is fed back to the output of the first $G_M$ element. Also shown in this Figure is one possible capacitance switching for changing the filter characteristics in accordance with different communication standards. As shown therein, three capacitors are shown coupleable to the output of each $G_M$ element (a FIG. 2 type of transconductance element assumed). Once the values of the $D_i$s are set to compensate for the RC process variation, one set of capacitors C11, C21, C31 and C41, or C12, $C_{22}$, C32 and C42, or C13, C23, C33 and C43 may be switched into the circuit at any one time to operate for a respective communication standard, such as, by way of example, for the GSM, WCDMA and TDMA standards. As one alternative, for each integrator, the capacitors may be sized so that one has the minimum capacitance needed for one standard, the second has a capacitance which, when added to the first, provides the next larger capacitance needed for another standard, and the third has a capacitance which, when added to the first and second, provides the largest capacitance needed for the third standard. In this case, the capacitors would be switched into the respective integrator as the first capacitor only, the first and second in parallel or the first, second and third in parallel for the different standards. This switching may be more complex however, as the switching for different integrators may be different, depending on the standards involved.

Figure 6:
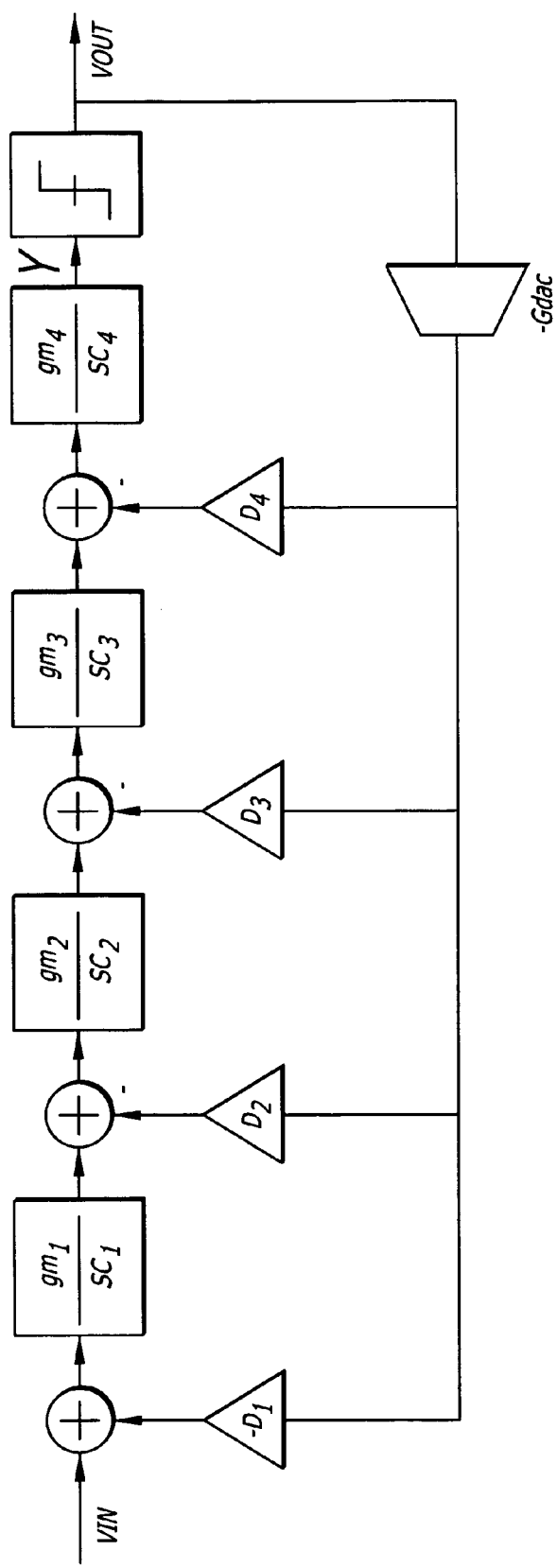
FIG. 6 is a diagram of a 4th order feedback filter in which the present invention is incorporated.

Now referring to FIG. 6, a diagram of a 4th order feedback filter in which the present invention is incorporated may be seen. While the previous embodiments were feed forward filters, the present invention is equally applicable to feedback filters. Again, the filter may be trimmed/tuned to compensate for process variation of the resistance and capacitance values by adjusting the resistance values in the feedback transconductances based on some power of the product of a measured capacitance and measured resistance divided by the nominal value for that product.

The present invention effectively solves the problems of conventional techniques as follows:

1) Since only the feed-forward and/or feedback coefficients (for example, $D_1$–$D_4$, $G_2$ of FIG. 1) are adjusted, they have little impact on the noise performance of the filter/ADC;

2) Each $D_i$ only needs to change once, since it is independent of the targeting application standards, as they are scaled with loop-filter poles accordingly (for example, see Table above). More specifically, for multi-band/multi-standard applications, the poles are changed for different standards by switching different capacitors (or alternatively different resistors) into the filter circuit. Since the elements that are switched in and out are on the same integrated circuit as the basic filter circuit, they are subject to the same process variation as was corrected for one standard by changing the $D_i$ values. Thus the proportionality of pole positions for different standards will be preserved without changing the $D_i$ values once they are set for adjusting pole positions for one standard.

Therefore, for multi-band/multi-standard applications, this new method is very attractive in terms of die size saving, power consumption reduction and trim/tuning simplicity. The embodiments disclosed herein have been disclosed in the context of single ended circuits, though differential circuits may be preferred in many embodiments. In that regard, it will be obvious to one skilled in the art from the disclosure herein how to extend the concepts disclosed to any feed forward continuous time filter of any number of poles, whether in a single ended or differential form.

In the foregoing specification, the invention has been described with reference to specific embodiments thereof. It will be evident however, that various modifications and changes may be made thereto without departing from the broader spirit and scope of the invention. The specification and drawings are, accordingly, to be regarded in an illustrative rather than a restrictive sense.

What is claimed is:

1. A method of trim/tuning for process variations in a filter having a plurality of integrators coupled in series, each having a resistance element and a capacitance element with values that are sensitive to process variations, and a plurality of additional elements as feed forward elements, feedback elements or both, comprising:
   providing as the additional elements, transconductance elements including a resistance with the same process variation as the resistance elements of the integrators;
   adjusting the resistance in the transconductance elements to trim/tune the filter.

2. A method of trim/tuning for process variations in multiple filters, each having a plurality of integrators coupled in series, each having a resistance element and a capacitance element with values that are sensitive to process variations, and a plurality of additional elements as feed forward elements, feedback elements or both, comprising, for each filter:
   providing as the additional elements, transconductance elements including a resistance with the same process variation as the resistance elements of the integrators;
   adjusting the resistance in the transconductance elements to trim/tune the filter; and switching predetermined ones of untrimmed capacitors into the integrators as the capacitive element for the respective integrator to make predetermined changes in the tuning of the filter;

the same switching combinations being used for the multiple filters irrespective of process variations between filters.

3. The method of claim 1 wherein the filter includes at least one feed forward transconductance element and at least one feedback transconductance element.

4. The method of claim 1 further comprising measuring the process variation by determining a ratio between a), the product of an actual value of a resistance element and an actual value of a capacitance element and b) a nominal value for the same product, and adjusting the resistances in the transconductance elements to trim/tune the filter responsive to the ratio.

5. The method of claim 4 wherein the resistance in each of the transconductance elements is adjusted in proportion to a respective power of the ratio between the product of the actual value of a resistance element and a capacitance element and a nominal value for the product, the respective power being determined by circuit analysis of the filter.

6. The method of claim 1 wherein the integrators comprise transconductance amplifiers, each having a capacitive load.

7. The method of claim 1 wherein the integrators comprise operational amplifiers each having a resistive input and capacitive feedback to an inverting input of the operational amplifier.

8. The method of claim 1 wherein the resistance in each transconductance element is adjusted by selective coupling one or more resistances to the respective transconductance element from a selection of resistance elements.

9. The method of claim 8 wherein the selection of resistance elements are configured to be selectable in a thermometer code.

10. The method of claim 8 wherein the selection of resistance elements are configured to be selectable in a binary code.

11. The method of claim 1 the filter is a $4^{th}$ order filter.

12. A filter comprising:

a plurality of integrators coupled in series, each having a resistance element and a capacitance element with values that are sensitive to process variations;

a plurality of transconductance elements, each having a resistance element that has the same sensitivity to process variations as the resistance elements in the integrators, the transconductance elements being configured as feed forward elements, feedback elements or both;

the resistance elements in the transconductance elements being adjustable to trim/tune the filter to compensate for the process variations in the resistance elements and the capacitance elements of the integrators.

13. A plurality of filters, each having:

a plurality of integrators coupled in series, each having a resistance element and a capacitance element with values that are sensitive to process variations;

a plurality of transconductance elements, each having a resistance element that has the same sensitivity to process variations as the resistance elements in the integrators, the transconductance elements being configured as feed forward elements, feedback elements or both;

the resistance elements in the transconductance elements being adjustable to trim/tune the filter to compensate for the process variations in the resistance elements and the capacitance elements;

a plurality of untrimmed capacitors for each integrator and a plurality of switches, the switches being adapted to switch predetermined ones of the plurality of untrimmed capacitors into the integrators as the respective capacitive element to make predetermined changes in the tuning of the filter responsive to predetermined switch closings;

the same switch closings being used for each of the plurality of filters irrespective of process variations between the filters.

14. The filters of claim 13 further comprising a respective plurality of resistance elements associated with each transconductance element, wherein the resistance in each transconductance element is adjustable by selective coupling one or more resistance elements to each transconductance element from the respective plurality of resistance elements.

15. The filters of claim 14 wherein the selection of resistance elements are configured to be selectable in a thermometer code.

16. The filters of claim 14 wherein the selection of resistance elements are configured to be selectable in a binary code.

17. The filters of claim 14 wherein the resistance elements are selectable by semiconductor switches.

18. The filter of claim 12 wherein the filter includes at least one feed forward transconductance element and at least one feedback transconductance element.

19. The filter of claim 12 wherein the integrators comprise transconductance amplifiers, each having a capacitive load.

20. The filter of claim 12 wherein the integrators comprise operational amplifiers each having a resistive input and capacitive feedback to an inverting input terminal of the operational amplifier.

21. The filter of claim 12 wherein the filter is a $4^{th}$ order filter.

22. The filter of claim 12 further comprising a $\Delta$-$\Sigma$ analog to digital converter coupled to an output of the filter.

23. The filter of claim 22 further comprised of a digital to analog converter coupled to an output of the $\Delta$-$\Sigma$ analog to digital converter, an output of the digital to analog converter being fed back to a summing point for combining with an input to the filter.

24. A $\Delta$-$\Sigma$ analog to digital converter system comprising:

a filter having:

a plurality of integrators coupled in series, each having a resistance element and a capacitance element with values that are sensitive to process variations;

a plurality of transconductance elements, each having a resistance element that has the same sensitivity to process variations as the resistance elements in the integrators, each transconductance element being configured as a feed forward element or a feedback element;

the resistance in the transconductance elements being adjustable to trim/tune the filter to compensate for the process variations in the resistance elements and the capacitance elements of the integrators;

a $\Delta$-$\Sigma$ analog to digital converter coupled to an output of the filter;

a digital to analog converter coupled to an output of the $\Delta$-$\Sigma$ analog to digital converter; and, an output of the digital to analog converter being coupled to an input of the filter.

25. A plurality of Δ-Σ analog to digital converter systems, each comprising:
- a filter having:
  - a plurality of integrators coupled in series, each having a resistance element and a capacitance element with values that are sensitive to process variations;
  - a plurality of transconductance elements, each having a resistance element that has the same sensitivity to process variations as the resistance elements in the integrators, each transconductance element being configured as a feed forward element or a feedback element;
  - the resistance in the transconductance elements being adjustable to trim/tune the filter to compensate for the process variations in the resistance elements and the capacitance elements;
- a plurality of untrimmed capacitors for each integrator and a plurality of switches, the switches being adapted to switch predetermined ones of the plurality of untrimmed capacitors into the integrators as the respective capacitive element to make predetermined changes in the tuning of the filter responsive to predetermined switch closings;
- a Δ-Σ analog to digital converter coupled to an output of the filter;
- a digital to analog converter coupled to an output of the Δ-Σ analog to digital converter; and,
- an output of the digital to analog converter being coupled to an input of the filter, the same switching combinations being used for multiple filters irrespective of process variations between the filters.

26. The Δ-Σ analog to digital converter systems of claim 25 further comprising a plurality of resistance elements associated with each transconductance element, wherein the resistance in each transconductance element is adjustable by selective coupling one or more resistances to each respective transconductance element from the respective plurality of resistance elements.

27. The Δ-Σ analog to digital converter systems of claim 26 wherein the selection of resistance elements in each converter system are configured to be selectable in a thermometer code.

28. The Δ-Σ analog to digital converter systems of claim 26 wherein the selection of resistance elements in each converter system are configured to be selectable in a binary code.

29. The Δ-Σ analog to digital converter systems of claim 26 wherein the resistance elements in each converter system are selectable by semiconductor switches.

30. The Δ-Σ analog to digital converter system of claim 24 wherein the integrators comprise transconductance amplifiers, each having a capacitive load.

31. The Δ-Σ analog to digital converter system of claim 24 wherein the integrators comprise operational amplifiers each having a resistive input and capacitive feedback to an inverting input terminal of the operational amplifier.

* * * * *